United States Patent
Ishii et al.

(10) Patent No.: US 8,093,599 B2
(45) Date of Patent: Jan. 10, 2012

(54) SILICON CARBIDE ZENER DIODE

(75) Inventors: Ryosuke Ishii, Amagasaki (JP); Koji Nakayama, Amagasaki (JP); Yoshitaka Sugawara, Amagasaki (JP); Hidekazu Tsuchida, Yokosuka (JP)

(73) Assignee: Central Research Institute of Electric Power Industry, Tokyo (JP)

(*) Notice: Subject to any disclaimer, the term of this patent is extended or adjusted under 35 U.S.C. 154(b) by 0 days.

(21) Appl. No.: 12/597,121

(22) PCT Filed: Apr. 25, 2008

(86) PCT No.: PCT/JP2008/058068
§ 371 (c)(1), (2), (4) Date: Oct. 22, 2009

(87) PCT Pub. No.: WO2008/136409
PCT Pub. Date: Nov. 13, 2008

(65) Prior Publication Data
US 2010/0084663 A1    Apr. 8, 2010

(30) Foreign Application Priority Data

Apr. 26, 2007 (JP) ................................. 2007-116736

(51) Int. Cl.
*H01L 29/866* (2006.01)
(52) U.S. Cl. .......................................... 257/77; 257/603
(58) Field of Classification Search .................... 257/77, 257/603, E29.104, E29.335; 438/105, 931
See application file for complete search history.

(56) References Cited

U.S. PATENT DOCUMENTS

| | | | |
|---|---|---|---|
| 4,775,643 A * | 10/1988 | Wetteroth | 438/533 |
| 4,891,685 A * | 1/1990 | Einthoven et al. | 257/496 |
| 5,541,140 A | 7/1996 | Goebel et al. | |
| 7,488,973 B2 * | 2/2009 | Sugawara | 257/40 |
| 2007/0200115 A1 * | 8/2007 | Das et al. | 257/77 |
| 2010/0032686 A1 | 2/2010 | Ishii et al. | |

FOREIGN PATENT DOCUMENTS

| | | |
|---|---|---|
| EP | 2110857 A1 | 10/2009 |
| JP | 54112189 A | 9/1979 |
| JP | 1260863 A | 10/1989 |
| JP | 7038123 A | 2/1995 |
| JP | 2000340807 A | 12/2000 |
| JP | 2002185015 A | 6/2002 |
| JP | 2002313936 A | 10/2002 |
| JP | 2006013129 A | 1/2006 |
| WO | 0249114 A2 | 6/2002 |
| WO | WO 2005013361 A1 * | 2/2005 |

OTHER PUBLICATIONS

Vassilevski, K. et al., "Fabrication and electrical characterization of 4H-SiC p+-n-n+ diodes with low differential resistance", Solid-State Electronics, Jul. 2000, pp. 1175-1177, vol. 44, Elsevier Science Ltd., GB.

* cited by examiner

*Primary Examiner* — Steven Loke
*Assistant Examiner* — David Ziskind
(74) *Attorney, Agent, or Firm* — The Webb Law Firm

(57) ABSTRACT

A silicon carbide Zener diode is a bipolar semiconductor device that has a mesa structure and includes a silicon carbide single crystal substrate of a first conductivity type, formed thereon, a silicon carbide conductive layer of a first conductivity type, and a silicon carbide conductive layer of a second conductivity type formed on the silicon carbide conductive layer of a first conductivity type, wherein a depletion layer that is formed under reverse bias at a junction between the silicon carbide conductive layer of a first conductivity type and the silicon carbide conductive layer of a second conductivity type does not reach a mesa corner formed in the silicon carbide conductive layer of a first conductivity type.

16 Claims, 6 Drawing Sheets

SILICON CARBIDE ZENER DIODE

FIELD OF THE INVENTION

The present invention relates to Zener diodes, in particular Zener diodes having silicon carbide.

BACKGROUND OF THE INVENTION

Zener diodes are bipolar devices that have a p-n junction with high carrier densities. They utilize breakdown (avalanche breakdown or Zener breakdown) that takes place under reverse bias. When the breakdown voltage is exceeded, the diodes keep the voltage between terminals constant irrespective of the current (hereinafter, the Zener voltage).

Zener diodes having silicon (Si) or the like are known. However, silicon power semiconductor devices have reached the limits of silicon properties, and enhancing the performances thereof is difficult.

Silicon carbide (SiC) is a promising semiconductor material for power devices due to its favorable electrical and physical properties. For example, a breakdown strength and a thermal conductivity of SiC are almost ten times and three times higher than those of Si, respectively.

SiC p-n diodes are well known as SiC bipolar devices (Patent Document 1). For example, compared to a Si p-n diode with a breakdown voltage of 10 kV, a SiC p-n diode with a breakdown voltage of 10 kV has an approximately ⅓ forward voltage and an approximately ¹⁄₂₀ or less reverse recovery time, and can reduce electric loss to approximately ⅕ or less, thereby greatly contributing to energy saving.

SiC bipolar devices other than SiC p-n diodes, for example SiC n-p-n transistors, SiC SIAFET and SiC SIJFET are also reported to reduce electric loss.
Patent Document 1: JP-A-2002-185015

To obtain SiC Zener diodes having a high current capacity, it is necessary that the breakdown current flows uniformly through the entire p-n junction. In SiC Zener diodes having a mesa structure, however, it has been found that electric fields are concentrated in a region where the p-n junction exposes to aside face of the mesa wall (hereinafter, the region will be referred to as a p-n junction end on the mesa wall) as shown in an image and a sketch thereof in FIG. 2 and FIG. 3, respectively. As a result, a current is conducted locally and a high current capacity cannot be obtained. This problem will be described in detail below.

Depletion layers formed in biased p-n diodes behave differently in Zener diodes and p-n diodes other than Zener diodes. In p-n diodes other than Zener diodes, a depletion layer formed at a p-n junction grows in the thickness direction of a first conductivity type layer with increasing voltage and finally reaches the bottom of the first conductivity type layer. This behavior is because the doping density of the first conductivity type layer except the substrate is low in the range of $10^{14}$ to $10^{16}$ cm$^{-3}$ and the depletion layer extends easily. The diode sustains the applied voltage through the thickness direction of the first conductivity type layer (the thickness of the first conductivity type layer except the substrate ranges from several tens of μm to 300 μm), and therefore the diodes can withstand a high voltage. However, when a depletion layer formed at the p-n junction extends beyond a mesa corner, electric fields are concentrated at the mesa corner. This causes breakdown at the mesa corner, and consequently the withstand voltage is limited. Herein, the "mesa corner" indicates a region of a conductive layer and a junction termination extension in a p-n diode in which a flat region around the mesa structure (hereinafter, the mesa bottom) and a side face of the mesa structure cross each other. As an example, FIG. 4 shows an image obtained by analyzing an electric field distribution in a p-n diode other than Zener diodes by electric field simulation. FIG. 5 which is a sketch of FIG. 4 shows regions where the electric fields are stronger in the order of $E_{11} > E_{10} > E_9 > E_8 > E_7 > E_6$. FIG. 5 indicates that the electric field is high at the p-n junction, and in particular at the mesa corner.

In Zener diodes, the doping density in the first conductivity type layer except the substrate is usually high in the range of $5 \times 10^{16}$ to $2 \times 10^{19}$ cm$^{-3}$, and a depletion layer formed at the p-n junction do not substantially grow. Further, the thickness of the depletion layer is not more than 0.5 μm in diodes having a Zener voltage of 100 V or less, and is not more than 2.5 μm in diodes having a Zener voltage of 400 V or less. It has been then found that because the depletion layer in the Zener diodes is unlikely to reach the mesa corner in contrast to the p-n diodes other than the Zener diodes, the electric field concentration occurs not at the mesa corner but at the p-n junction end on the mesa wall.

The present invention is aimed at solving the problems described above. It is therefore an object of the invention to provide SiC Zener diodes that are free of electric field concentration at the p-n junction end on the mesa wall and thereby have a high current capacity.

SUMMARY OF THE INVENTION

The present inventors studied diligently to achieve the above object. They have then found that SiC Zener diodes having a high current capacity are obtained by forming a junction termination extension around the mesa structure continually at least from the p-n junction to the mesa bottom, whereby the breakdown current can flow through the entire p-n junction. The present invention has been completed based on the finding.

A silicon carbide Zener diode according to the present invention has a mesa structure and comprises a silicon carbide single crystal substrate of a first conductivity type, formed thereon, a silicon carbide conductive layer of a first conductivity type, and a silicon carbide conductive layer of a second conductivity type formed on the silicon carbide conductive layer of a first conductivity type, wherein a depletion layer that is formed under reverse bias at a junction between the silicon carbide conductive layer of a first conductivity type and the silicon carbide conductive layer of a second conductivity type does not reach a mesa corner formed in the silicon carbide conductive layer of a first conductivity type.

In a mesa peripheral region around the mesa structure, a continuous junction termination extension is preferably formed at least from the p-n junction to the mesa corner.

Preferably, the junction termination extension has a thickness of 10 nm to 1 μm. When the junction termination extension is of a first conductivity type, the doping density of the junction termination extension of a first conductivity type is preferably not more than 50% of the doping density of the silicon carbide conductive layer of a first conductivity type. When the junction termination extension is of a second conductivity type, the doping density of the junction termination extension of a second conductivity type is preferably not more than 25% of the doping density of the silicon carbide conductive layer of a first conductivity type.

In the formation of junction termination extension, doping by diffusion is usually difficult because SiC has a lower diffusion rate for impurity atoms than does silicon. In the present invention, the junction termination extension is preferably formed by ion implantation, and more preferably by ion implantation of aluminum, nitrogen or phosphorus.

The silicon carbide conductive layer of a first conductivity type is preferably formed by epitaxial growth and has a thickness of not less than 2 μm.

In the SiC Zener diodes according to the present invention, a continuous junction termination extension is formed in the mesa peripheral region at least from the p-n junction to the mesa bottom, whereby electric field concentration at breakdown can take place at the p-n junction region inside the diode and the current can flow through the p-n junction region inside the diode, and the current capacity is increased.

PREFERRED EMBODIMENTS FOR CARRYING OUT THE INVENTION

Figure 1:
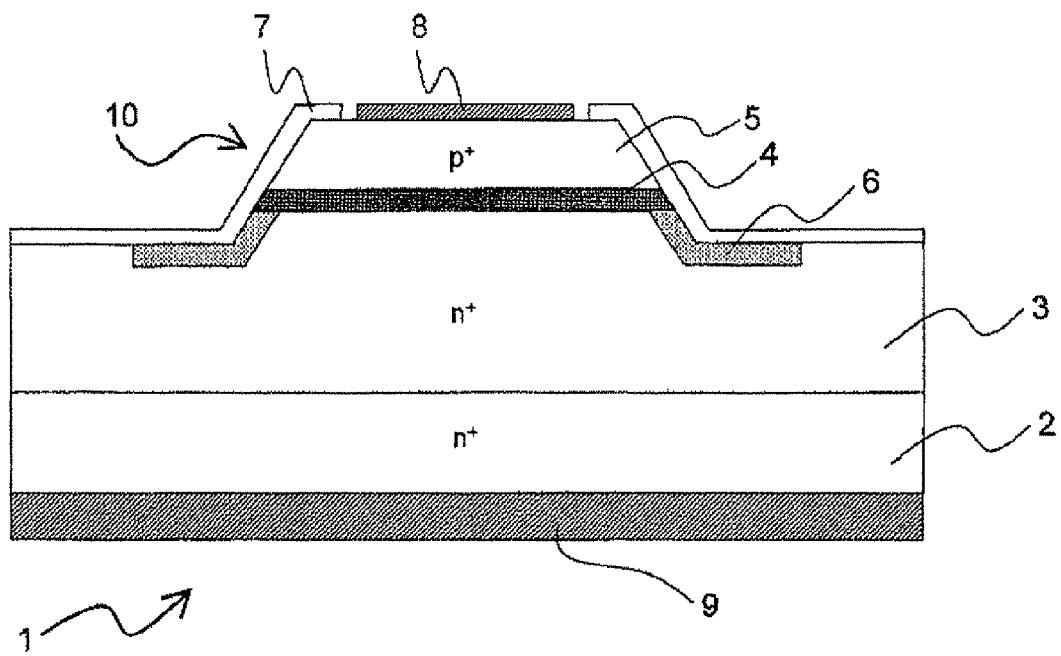
FIG. 1 shows a schematic cross sectional view of a silicon carbide (SiC) Zener diode according to an embodiment of the present invention.

FIG. 1 shows Silicon carbide (SiC) Zener diodes according to the present invention, which will be described in detail.

A silicon carbide Zener diode 1 according to the present invention has a mesa structure and includes a silicon carbide single crystal substrate 2 of a first conductivity type, formed thereon, a silicon carbide conductive layer 3 of a first conductivity type, and a silicon carbide conductive layer 5 of a second conductivity type formed on the silicon carbide conductive layer 3 of a first conductivity type; and a depletion layer that is formed under reverse bias at a junction between the silicon carbide conductive layer 3 of a first conductivity type and the silicon carbide conductive layer 5 of a second conductivity type does not reach a mesa corner formed in the silicon carbide conductive layer 3 of a first conductivity type.

In a mesa peripheral region around the mesa structure, a continuous junction termination extension 6 is preferably formed at least from the p-n junction to the mesa corner formed in the silicon carbide conductive layer 3 of a first conductivity type.

[Junction Termination Extension]

The junction termination extension in the silicon carbide Zener diodes of the present invention will be described first.

The junction termination extension 6 is provided to relax local electric field concentration caused when a reverse voltage is applied to the p-n diode. The doping density of the junction termination extension exerts different effects on the distribution of electric field or the like in Zener diodes and diodes other than Zener diodes. The present inventors analyzed by electric field simulation the influences of the doping density of junction termination extension on the electric field and breakdown voltage in Zener diodes and p-n diodes other than Zener diodes. The results will be discussed below with reference to FIGS. 2 to 7.

Figure 6:
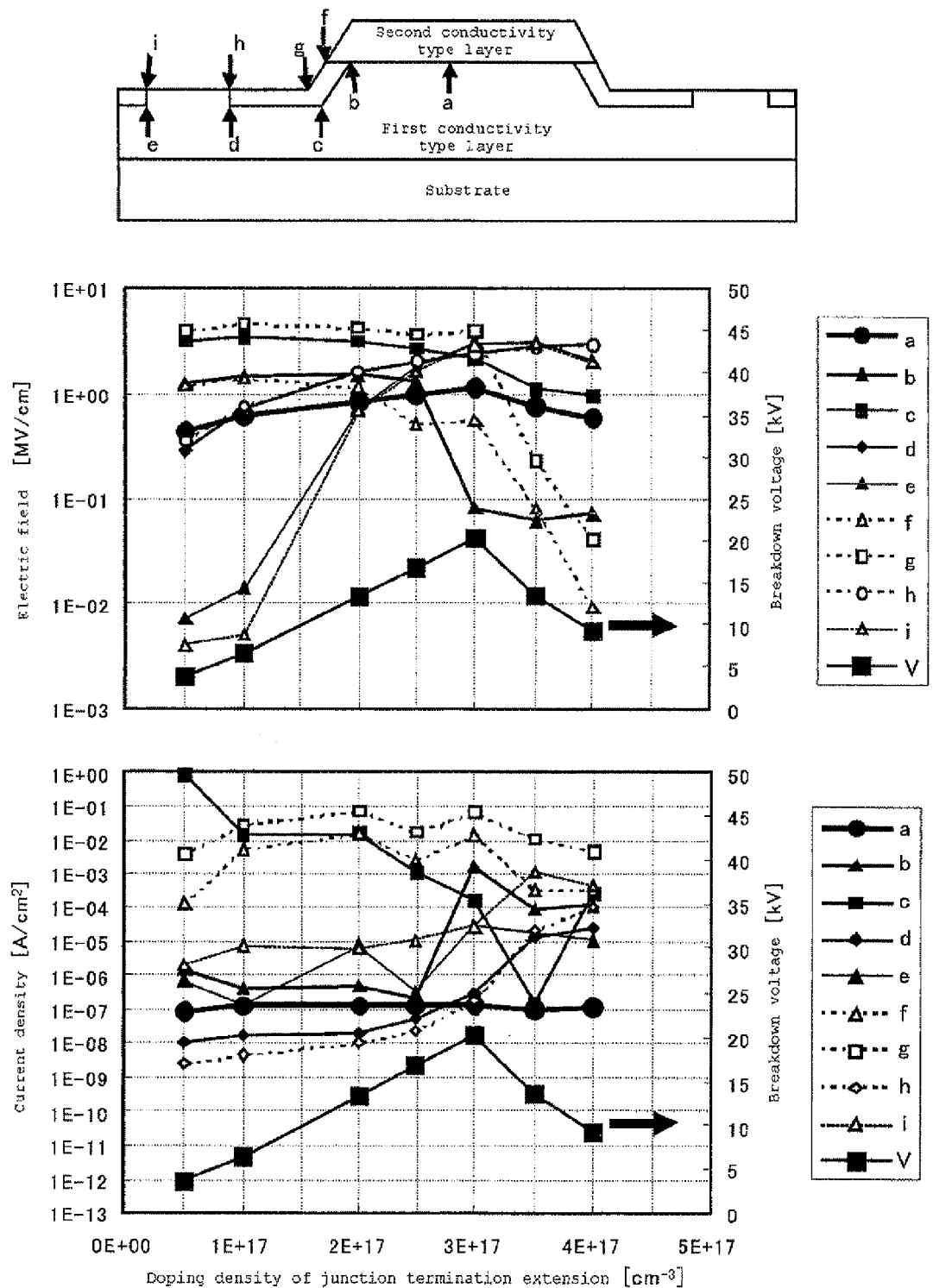
FIG. 6 shows a relationship between the electric field or current density distribution in p-n diodes other than Zener diodes, and the doping density of a junction termination extension (In the figure, the first conductivity type layer is an n-type and has a doping density of $1\times10^{14}$ cm$^{-3}$)

In p-n diodes other than Zener diodes, the doping density or shape of junction termination extension is determined in order to obtain the maximum withstand voltage. FIG. 6 shows the results of electric field simulation which analyzed the changes in electric field and current density distribution by differing doping densities of junction termination extension in p-n diodes other than Zener diodes. The first conductivity type layer of the p-n diode illustrated in FIG. 6 is an n-type and has a doping density of $1\times10^{14}$ cm$^{-3}$. The upper view in FIG. 6 is a cross sectional view of the p-n diode, in which a polygonal region enclosed by letters h-g-f-b-c-d corresponds to a junction termination extension and a rectangular region having a right side i-e corresponds to a field stop layer. In p-n diodes other than Zener diodes, the junction termination extension is of a second conductivity type and has a doping density in the range of about $10^{16}$ to $10^{18}$ cm$^{-3}$, approximately two orders of magnitude higher than that of the first conductivity type layer.

Of the p-n diodes shown in FIG. 6, those having a low doping density of the junction termination extension ($\leq$2E+17 cm$^{-3}$) have the highest electric field at mesa corners c and g (FIG. 6). That is, breakdown takes place at the mesa corners. The high electric field at the mesa corners is probably due to the fact that the mesa corners have great change in shape and are a boundary of materials having differing properties and electrical characteristics. With increasing doping density of the junction termination extension, the electric field is increased at a junction termination extension end d or a field stop layer end e. The maximum withstand voltage is obtained at an doping density which gives approximately equal electric field intensities at the mesa corners, the junction termination extension and the field stop layer (corresponding to a doping density of 3E+17 cm$^{-3}$ in FIG. 6). (The withstand voltage herein corresponds to a breakdown voltage shown by line V in FIG. 6.) At the maximum withstand voltage, breakdown takes place at any of the p-n junction end on the mesa wall, the mesa corner, the junction termination extension end and the field stop layer end. When the doping density of the junction termination extension is further increased, the breakdown site showing the highest electric field shifts from the field stop layer end e to the junction termination extension end h (corresponding to a doping density of 4E+17 cm$^{-3}$ in FIG. 6).

Figure 7:
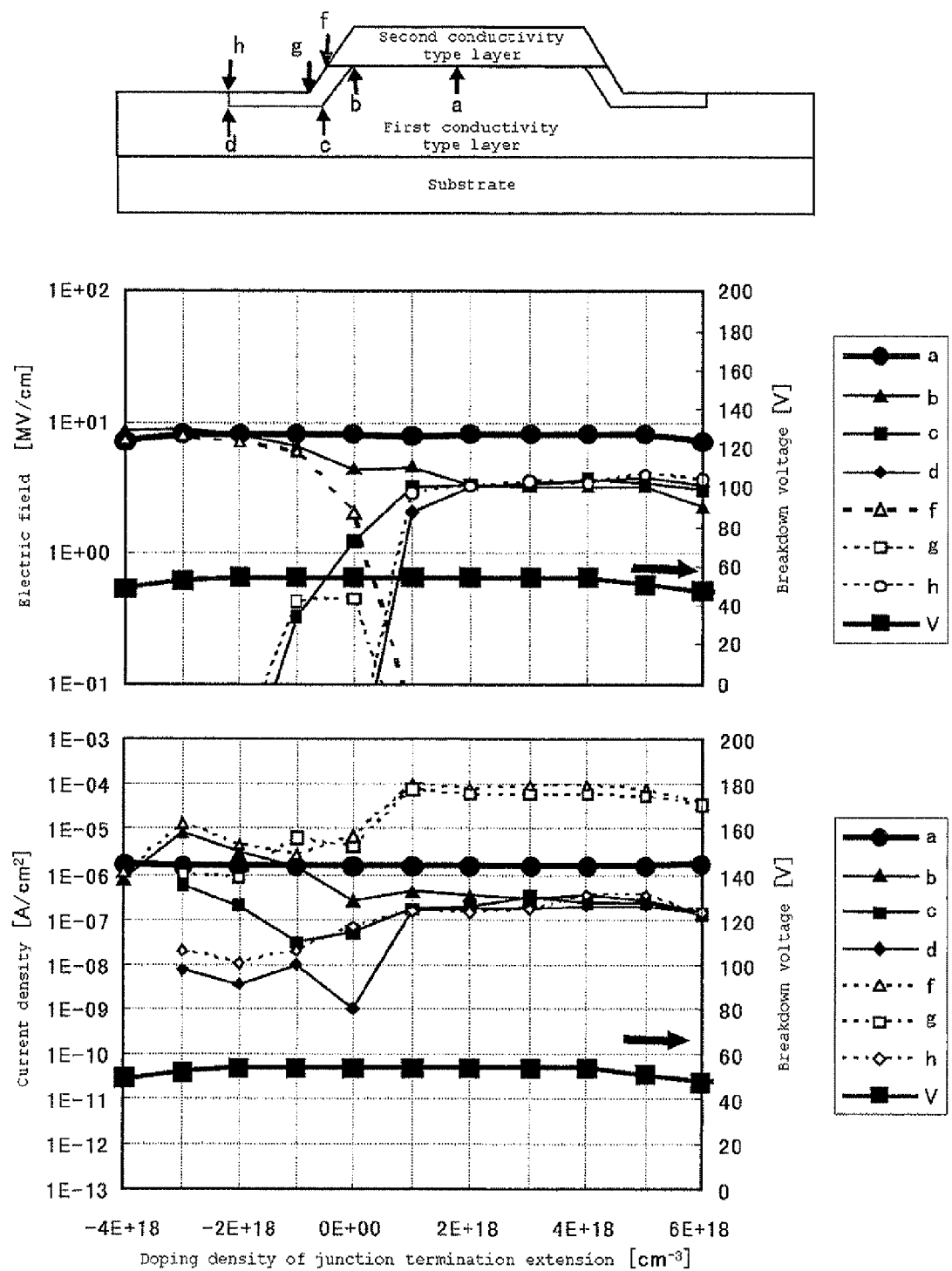
FIG. 7 shows a relationship between the electric field or current density distribution in SiC Zener diodes, and the doping density of a junction termination extension (In the figure, the first conductivity type layer is an n-type and has a doping density of $4\times10^{18}$ cm$^{-3}$)

In Zener diodes, the doping density or shape of junction termination extension is determined in order to obtain breakdown at the p-n junction. FIG. 7 shows the results of simulation which analyzed the changes in electric field and current density distribution by differing doping densities of junction termination extension in Zener diodes. The first conductivity type layer of the Zener diode illustrated in FIG. 7 is an n-type and has a doping density of $4\times10^{18}$ cm$^{-3}$. The upper view in FIG. 7 is a cross sectional view of the Zener diode, in which a polygonal region enclosed by letters h-g-f-b-c-d corresponds to a junction termination extension. In the Zener diodes, the junction termination extension may be of a first conductivity type or a second conductivity type.

Figure 2:
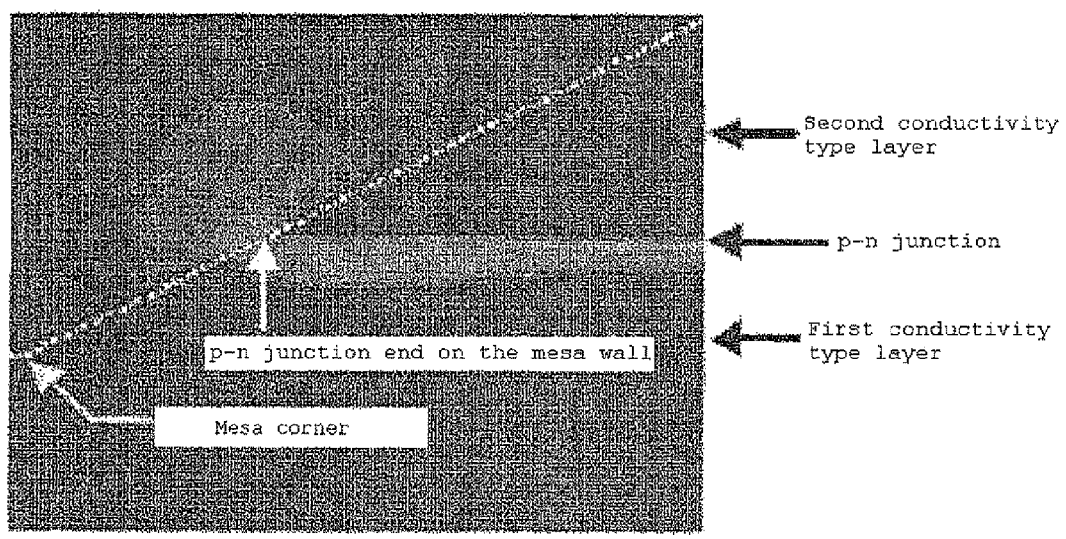
FIG. 2 shows an electric field distribution of a Zener diode having no junction termination extension.
Figure 3:
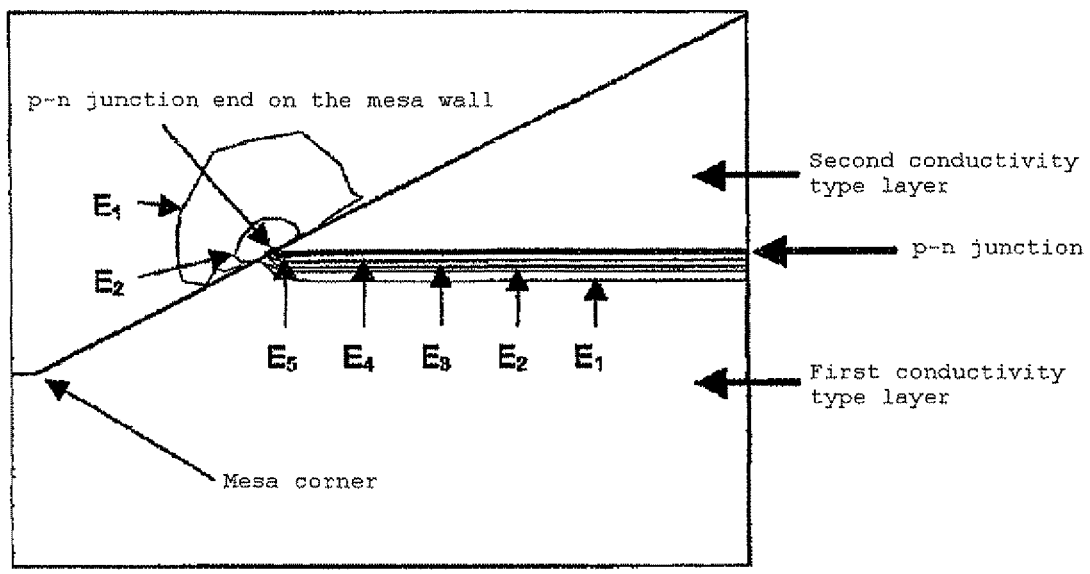
FIG. 3 shows a sketch of the electric field distribution of a Zener diode having no junction termination extension in FIG. 2.
Figure 4:
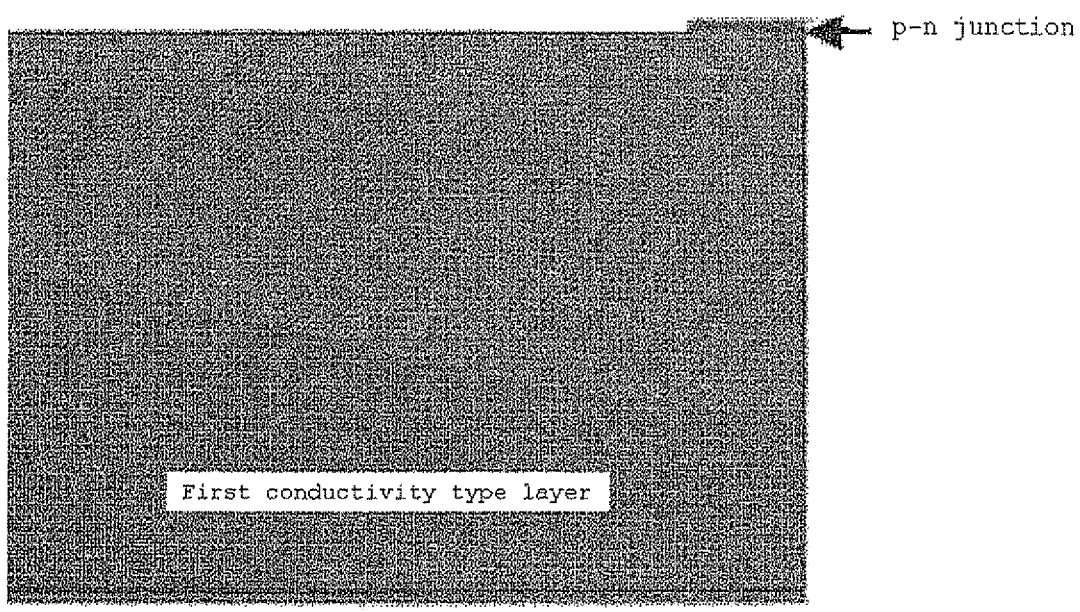
FIG. 4 shows an electric field distribution of a p-n diode other than Zener diodes.
Figure 5:
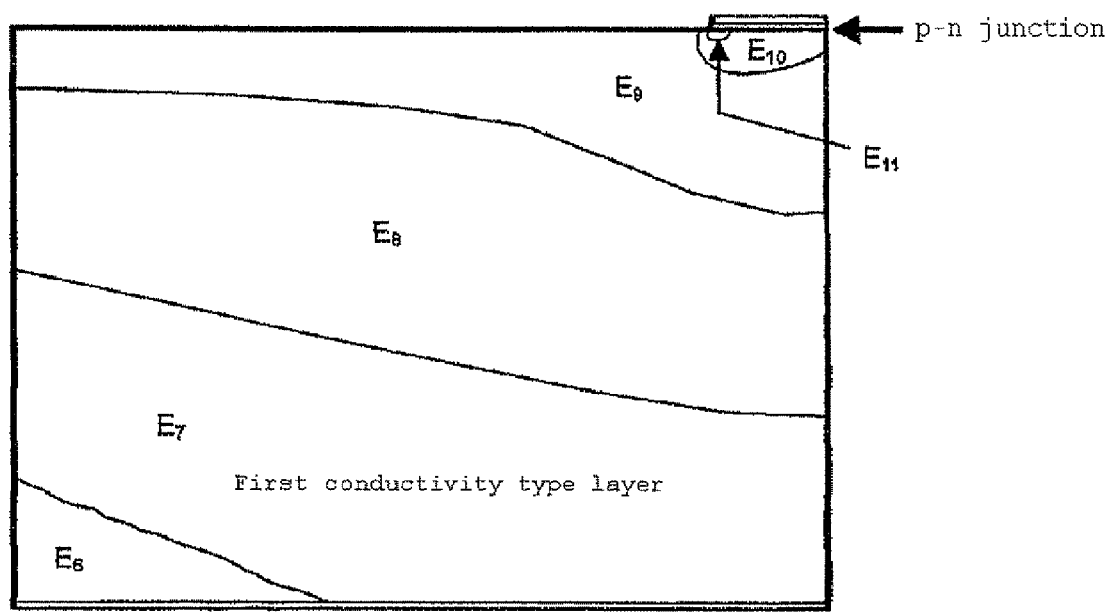
FIG. 5 shows a sketch of the electric field distribution of a p-n diode other than Zener diodes in FIG. 4.

When there is no junction termination extension (corresponding to a doping density of −4E+18 cm$^{-3}$ in FIG. 7), the electric field is highest at a p-n junction end on the mesa wall f, and the p-n junction end on the mesa wall is a breakdown site. FIG. 2 shows an electric field distribution of a Zener diode having no junction termination extension according to electric field simulation. FIG. 3 which is a sketch of FIG. 2 shows regions where the electric fields are stronger in the order of $E_5 > E_4 > E_3 > E_2 > E_1$. The electric fields are concentrated at the p-n junction, in particular at the p-n junction end on the mesa wall.

The influences of the doping density of junction termination extension on the electric field or the like vary depending on whether the junction termination extension is of a first conductivity type or a second conductivity type. A negative doping density and a positive doping density correspond to a junction termination extension of a first conductivity type and a junction termination extension of a second conductivity type, respectively. When the doping density is 0 (zero), the numbers of donors and acceptors are equal and the apparent difference in numbers of donors and acceptors is 0.

When the junction termination extension is of a first conductivity type, the electric field is highest at the p-n junction end on the mesa wall f when the doping density of the junction termination extension is not less than 50% of the doping density of the first conductivity type layer (FIG. 7) (corresponding to a doping density of not more than −2E+18 cm$^{-3}$). When the doping density of the junction termination extension is not more than 50% of the doping density of the first conductivity type layer (corresponding to a doping density from −2E+18 cm$^{-3}$ to 0E+00 cm$^{-3}$), the electric field is highest at the p-n junction a. Thus, it is preferable in the present invention that when the junction termination extension is of a first conductivity type, the doping density thereof is not more than 50% of the doping density of the first conductivity type layer. In detail, a junction termination extension of a first conductivity type which has a lower doping density than that of the first conductivity type layer may be formed by implanting second conductivity type ions such as Al ions or B ions into the first conductivity type layer.

When the junction termination extension is of a second conductivity type, the electric field is highest at the p-n junction a irrespective of the doping density of the junction termination extension (FIG. 7). However, when the doping density of the junction termination extension is equal to or higher than the doping density of the second conductivity type layer, the junction termination extension does not play its original role and functions similarly to the second conductivity type layer. Accordingly, it is necessary that the doping density of the junction termination extension is lower than that of the second conductivity type layer. If the doping density of the junction termination extension is more than 25% of the doping density of the first conductivity type layer, the electric field intensities at the mesa corner c and the junction termination extension end d are increased, and the current densities at the mesa corner surface g, the p-n junction end on the mesa wall f and the junction termination extension end d are also increased. In particular, the current densities at the mesa corner surface g and the p-n junction end on the mesa wall f are approximately two orders of magnitude higher than that at the p-n junction a (FIG. 7). These surface regions are a boundary in which different materials such as silicon carbide and a passivation layer (for example, a silicon dioxide layer) are in contact with each other. In view of long-term reliability (against thermal stress or the like), it is desirable that the current density at these surface regions is low. In the present invention, therefore, it is desirable that when the junction termination extension is of a second conductivity type, the doping density thereof is lower than the doping density of the second conductivity type layer, and is preferably not more than 25% of the doping density of the first conductivity type layer, and more preferably not more than 10% of the doping density of the first conductivity type layer.

[Zener Diodes]

An embodiment of the silicon carbide (SiC) Zener diodes and production thereof according to the present invention will be described in detail with reference to FIG. 1. This figure is only explanatory, and the actual size and the like are not particularly limited as long as the skilled person can carry out the present invention based on the description of the specification and common knowledge in the art. In the embodiment described below, the first conductivity type is an n-type and the second conductivity type is a p-type; however, the semiconductor devices of the invention are not limited to such embodiment.

<Conductive Layers>

An n$^+$ substrate 2 which is a silicon carbide substrate of a first conductivity type may be an n-type SiC single crystal substrate that is obtained by slicing an SiC bulk crystal formed by a sublimation method (a modified Lely method), a CVD method or the like.

A silicon carbide conductive layer 3 of a first conductivity type (an n$^+$ conductive layer) may be formed by growing on the n$^+$ substrate 2 an n$^+$ SiC single crystal layer that is of the same crystal type as the substrate 2. The n$^+$ conductive layer 3 has nitrogen or phosphorus as a dopant. The donor density of the n$^+$ conductive layer 3 is approximately $5 \times 10^{16}$ cm$^{-3}$ to $3 \times 10^{19}$ cm$^{-3}$. From the viewpoint of preventing stacking fault, the donor density is preferably not more than $2 \times 10^{19}$ cm$^{-3}$. By appropriately selecting the donor density in the above range, a Zener voltage of 10 to 500 V can be continually obtained.

In determining the thickness of the n$^+$ conductive layer 3, the following two points should be considered.

The first point is extension of a depletion layer. It is expected that a depletion layer formed at an interface between the n$^+$ conductive layer 3 and an ion implanted layer 4 of a second conductivity type will extend from the interface about several nm to 1 μm toward the n$^+$ substrate 2. Accordingly, the thickness of the n$^+$ conductive layer 3 should be at least larger than the several nm, and desirably larger than about 1 μm to make sure that the depletion layer will not reach a mesa corner.

Second, stacking faults present in the silicon carbide substrate should be considered. Silicon carbide substrates contain a large number of stacking fault nuclei that grow into stacking faults. The stacking faults grow by acquiring energy released when electrons and holes are recombined. Holes diffuse from the second conductivity type layer to the first conductivity type layer and possibly reach near the surface of the substrate. The holes that have reached near the substrate surface are recombined with electrons there. If a stacking fault nucleus is present in the vicinity of the recombination site, a stacking fault grows from the nucleus, leading to conductance degradation. In view of this point too, the n$^+$ conductive layer 3 should have at least a certain thickness.

The present inventors have found in the course of accomplishing this invention that the n$^+$ conductive layer 3 in the silicon carbide (SiC) Zener diodes preferably has a thickness of not less than 2 μm. In the case where an ion implanted layer 4 of a second conductivity type (described later) is provided, the thickness of the n$^+$ conductive layer 3 is preferably not less than 3 µm in consideration of the thickness of the ion implanted layer 4 of a second conductivity type ranging from 15 nm to 550 nm.

In the formation of the n⁺ conductive layer 3, epitaxial growth is preferably adopted so that the obtainable first conductivity type layer will have a lower defect density than the substrate.

Preferably, an ion implanted layer 4 of a second conductivity type (a p⁺ ion implanted layer) is formed on the surface of the n⁺ conductive layer 3. By providing the p⁺ ion implanted layer 4, a second conductivity type layer 5 (described later) may be epitaxially grown thereon while the doping density of the second conductivity type layer near the p-n junction is controlled more easily compared to when the p-n junction is formed by epitaxial growth alone. The thickness of the p⁺ ion implanted layer 4 is about 15 nm to 550 nm, and the doping density thereof is preferably not less than $1\times10^{17}$ cm$^{-3}$, and more preferably in the range of $2\times10^{18}$ cm$^{-3}$ to $2\times10^{21}$ cm$^{-3}$.

To form the p⁺ ion implanted layer 4, boron, aluminum or the like is implanted into the conductive layer 3 of a first conductivity type. In particular, aluminum is preferable because it provides a more stable doping density profile under high-temperature annealing.

In the formation of the p⁺ ion implanted layer 4, a box profile may be created by multistage energy ion implantation.

After the ion implantation and before the formation of a p⁺ conductive layer 5, the implanted ions are preferably activated by annealing at temperatures of 1600° C. to 1800° C. in an atmosphere such as Ar.

A silicon carbide conductive layer 5 of a second conductivity type (a p⁺ conductive layer) is formed on the p⁺ ion implanted layer 4. The p⁺ conductive layer 5 contains boron or aluminum as a dopant, and the acceptor density is approximately in the range of $5\times10^{18}$ cm$^{-3}$ to $2\times10^{21}$ cm$^{-3}$, and preferably $1\times10^{19}$ cm$^{-3}$ to $2\times10^{21}$ cm$^{-3}$. The p⁺ conductive layer 5 ensures that the p-n junction is sufficiently separated from an anode electrode described later and that problems such as punching through are prevented, increasing the yields. When the p⁺ ion implanted layer 4 is not formed, the p⁺ conductive layer 5 plays an essential role for the formation of p-n junction.

The p⁺ conductive layer 5 may be produced by growing a p⁺ SiC single crystal layer by an epitaxial growth method. The thickness of the p⁺ conductive layer 5 is about 1 µm or more, and preferably 2 µm or more.

<Mesa Structures>

A mesa structure 10 of the silicon carbide Zener diodes according to the present invention may be prepared by, for example, the following procedures.

First, a silicon oxide layer is formed in a thickness of about 10 µm by, for example, a CVD (chemical vapor deposition) method on the p⁺ conductive layer 5. On the silicon oxide layer, a photoresist layer corresponding to the mesa shape is formed by photolithography technique. Subsequently, the silicon oxide layer exposed from the photoresist layer is removed with hydrofluoric acid, whereby the silicon oxide layer on the p⁺ conductive layer 5 corresponds to the mesa shape. With this silicon oxide layer as a mask, the exposed area of the p⁺ conductive layer 5 is processed by, for example, reactive ion etching (RIE) to remove regions extending from the p⁺ conductive layer 5 to a depth in the n⁺ conductive layer 3, thereby forming a mesa structure 10. The height of the mesa structure 10 formed by etching should be larger than the total of the thickness of the p⁺ conductive layer 5 and the depth in which a depletion layer formed in the first conductivity type layer will extend. When the p⁺ ion implanted layer 4 is provided, the thickness of the p⁺ ion implanted layer 4 should be taken into consideration. Accordingly, the height of the mesa structure should be larger than the total of the thickness of the p⁺ conductive layer 5, the depth in which the depletion layer will extend, and the thickness of the p⁺ ion implanted layer 4. Thus, the height of the mesa structure 10 is desirably from 1 to 5 µm. The RIE mask is not limited to a silicon oxide layer and may be aluminum, nickel or the like.

<Junction Termination Extension 6>

A junction termination extension 6 of the silicon carbide Zener diodes according to the present invention may be prepared by, for example, the following procedures.

A silicon oxide layer is formed in a thickness of about 2 µm by, for example, a CVD method on the p⁺ conductive layer 5. On the silicon oxide layer, a photoresist layer corresponding to the shape of junction termination extension is formed by photolithography technique. Subsequently, the silicon oxide layer exposed from the photoresist layer, namely the area where the junction termination extension will be formed is removed with hydrofluoric acid, whereby the silicon oxide layer on the p⁺ conductive layer 5 corresponds to the shape of junction termination extension. With this silicon oxide layer as a mask, a dopant such as boron or aluminum is implanted to form a junction termination extension 6.

At the minimum implantation level of ion implantation apparatuses, ions are implanted into the conductive layer 5 to a thickness of about 10 nm. Accordingly, it is difficult to obtain a junction termination extension having a thickness of less than 10 nm. When a junction termination extension is formed in a thickness of more than 1 µm, ion implantation requires large amounts of energy and dopants as well as a prolonged operation time, increasing the costs for ion implantation. Accordingly, the thickness of the junction termination extension is preferably in the range of 10 nm to 1 µm, and more preferably 100 nm to 1 µm.

Herein, a junction termination extension of a first conductivity type which has a lower doping density than that of the first conductivity type layer may be formed by implanting second conductivity type ions such as Al ions or B ions into the first conductivity type layer.

When the junction termination extension 6 is of a second conductivity type, it is desirable that the doping density of the junction termination extension is lower than the doping density of the second conductivity type layer, and is preferably not more than 25% of the doping density of the first conductivity type layer, and more preferably not more than 10% of the doping density of the first conductivity type layer.

After the ion implantation, the implanted ions are preferably activated by annealing at temperatures of 1600° C. to 1800° C. in an atmosphere such as Ar.

It is necessary that the conductive layer 3 of a first conductivity type under the junction termination extension has a thickness. Therefore, the total thickness of the first conductivity type conductive layer 3, the second conductivity type ion implanted layer 4 and the second conductivity type conductive layer 5 is larger than the total of the height of the mesa structure and the thickness of the junction termination extension 6 formed in the first conductivity type conductive layer 3.

<Electrodes>

A cathode electrode 9 and an anode electrode 8 in the silicon carbide Zener diodes of the invention may be prepared by, for example, the following procedures.

First, an oxide layer 7 for protecting the device surface is formed. For example, an oxide layer may be formed in a thickness of about 40 nm by thermal oxidation.

Subsequently, unnecessary portions of the silicon oxide layer are removed by photolithography technique and with use of hydrofluoric acid, thereby exposing SiC. Thereafter, nickel as a cathode electrode 9 is deposited (to a thickness of 350 nm) on the lower surface of the n⁺ substrate 2 by a sputtering method or the like, and titanium and aluminum as an anode electrode 8 are deposited successively (to a thickness of 50 nm and a thickness of 125 nm, respectively) on the upper surface of the p⁺ conductive layer 5 by a sputtering method or the like. These thin metal layers are thereafter alloyed by annealing to form ohmic electrodes.

In the invention, the crystal types or crystal planes of the SiC single crystals are not particularly limited, and the advantageous effects of the invention are achieved with various kinds of crystals.

In the silicon carbide Zener diodes according to the above embodiment, the first conductivity type is an n-type and the second conductivity type is a p-type. The conductivity types may be reversed, that is, the first conductivity type may be a p-type and the second conductivity type may be an n-type. In this case, the silicon carbide Zener diode has a laminate in which a p⁺ substrate 2, a p⁺ conductive layer 3, an n⁺ ion implanted layer 4 and an n⁺ conductive layer 5 are laminated in this order. The n⁺ ion implanted layer 4 in this case is formed by implanting ions such as nitrogen or phosphorus into the p⁺ conductive layer 3. Similarly, the junction termination extension 6 is formed by implanting similar ions into the p⁺ conductive layer 3.

EXAMPLES

The present invention will be described in greater detail hereinbelow without limiting the scope of the invention.

Example 1

FIG. 1 is a cross sectional view of an SiC Zener diode in Example of the present invention.

(1) Production of Conductive Layers

An n⁺ substrate 2 (donor density: $7 \times 10^{18}$ cm$^{-3}$, thickness: 400 μm) was provided which was an n-type 4H—SiC single crystal substrate obtained by slicing an SiC bulk crystal produced by a sublimation method (a modified Lely method). On the substrate, an n⁺ SiC single crystal layer that was of the same crystal type as the n⁺ substrate 2 was epitaxially grown to form an n⁺ conductive layer 3. The n⁺ conductive layer 3 contained nitrogen as a dopant, and the donor density was $2 \times 10^{19}$ cm$^{-3}$.

Subsequently, aluminum ions and the like were implanted into the surface of the n⁺ conductive layer 3 to form a p-type ion implanted layer 4. The ion implantation conditions were such that the implanting energy was 30 keV and the dosage would be $4 \times 10^{15}$ cm$^{-2}$. The profile of doping density in the depth direction under these conditions indicated that the maximum doping density was $1 \times 10^{21}$ cm$^{-3}$, found at a depth of 30 nm from the implantation surface. Thereafter, the implanted ions were activated by annealing at 1800° C. in an atmosphere containing Ar.

Subsequently, a p⁺ SiC single crystal layer was epitaxially grown on the p⁺ ion implanted layer 4 to form a p⁺ conductive layer 5. The p⁺ conductive layer 5 contained aluminum as a dopant, and the acceptor density distributed in the range of $8 \times 10^{18}$ cm$^{-3}$ to $8 \times 10^{19}$ cm$^{-3}$ in the thickness direction of the p⁺ conductive layer 5.

(2) Production of Mesa Structure

A silicon oxide layer was formed in a thickness of about 10 μm by a CVD method on the p⁺ conductive layer 5. On the silicon oxide layer, a photoresist layer corresponding to a mesa shape was formed by photolithography technique. Subsequently, the silicon oxide layer exposed from the photoresist layer was removed with hydrofluoric acid. With this silicon oxide layer as a mask, the exposed area of the p⁺ conductive layer 5 was processed by reactive ion etching (RIE) to remove regions extending from the exposed p⁺ conductive layer 5 to a depth in the n⁺ conductive layer 3. A mesa structure 10 having a height of 4 μm was thus formed.

(3) Production of Junction Termination Extension

To relax the concentration of electric fields around the mesa structure, aluminum ions as dopants were implanted into the n⁺ conductive layer 3 to form a junction termination extension 6. In detail, the ions were implanted from the p-n junction to approximately 50 μm outside the mesa corner, that is, the area defined by f-g-h in FIG. 7 wherein the distance g-h was approximately 50 μm. This ion implantation was carried out in multistages under conditions such that the implanting energy ranged from 30 to 550 keV and the dosage would be $1 \times 10^{15}$ cm$^{-2}$. The profile of aluminum doping density in the depth direction under these conditions was a box profile in which the density was $1.5 \times 10^{19}$ cm$^{-3}$ from the vicinity of the implantation surface to a depth of 640 nm. After the ion implantation, the implanted ions were activated by annealing at 1800° C. in an atmosphere containing Ar. Provided that the implanted aluminum ions are 100% activated as acceptors by the annealing, the aluminum doping density offsets the doping density of the n⁺ conductive layer 3, $2 \times 10^{19}$ cm$^{-3}$, and consequently the doping density of the junction termination extension 6 is $5 \times 10^{18}$ cm$^{-3}$. That is, the junction termination extension 6 is an n-type conductive layer having a doping density that is 25% of that of the n⁺ conductive layer 3.

To protect the device surface, an oxide layer 7 was formed in a thickness of about 40 nm by thermal oxidation. Subsequently, unnecessary portions of the silicon oxide layer were removed by photolithography technique and with use of hydrofluoric acid, thereby exposing SiC. Thereafter, nickel as a cathode electrode 9 was sputtered to form a thin metal layer (thickness: 350 nm) on the lower surface of the n⁺ substrate 2. Similarly, titanium and aluminum as an anode electrode 8 were sputtered successively to form thin metal layers (thicknesses: 50 nm and 125 nm, respectively) on the upper surface of the p⁺ conductive layer 5. These metal layers were alloyed by annealing to form ohmic electrodes.

(4) Electric Characteristics of Zener Diode

Figure 8:
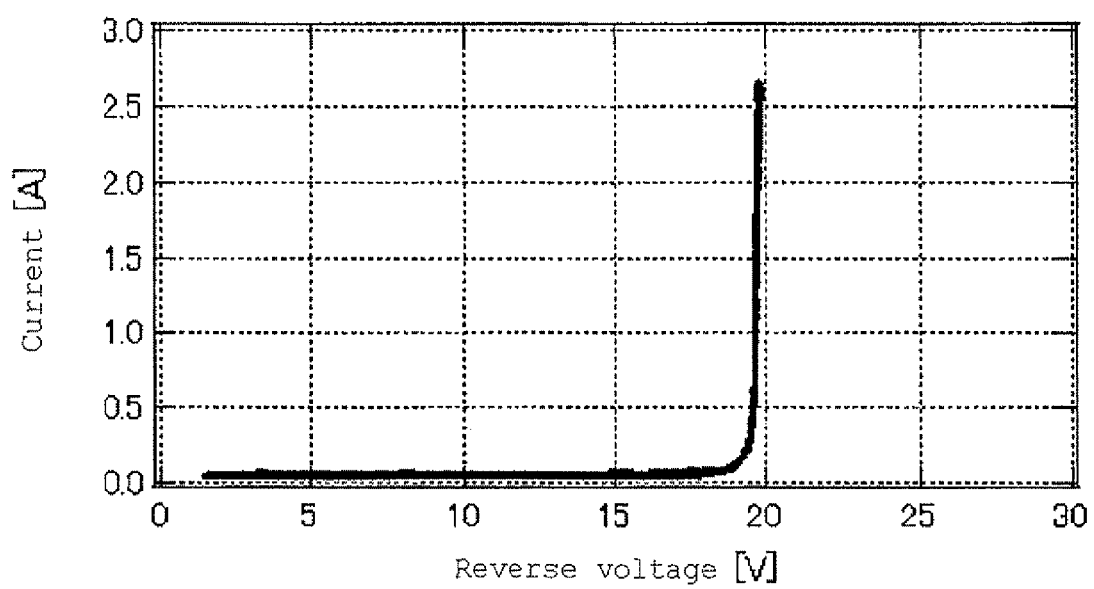
FIG. 8 shows a current-reverse voltage characteristics of a SiC Zener diode.

FIG. 8 shows electric characteristics of the Zener diode obtained above. The diode had an operating voltage of about 20 V, and the current showed a sharp rise at the operating voltage. The operating resistance was 0.01Ω, a several orders of magnitude less than those of existing SiC Zener diodes ranging from several Ω to several tens of Ω. One of the differences between the existing Zener diodes and the diodes of the invention is the presence of junction termination extension.

As described in Example above, the concentration of electric fields at the p-n junction end on the mesa wall is reduced and the breakdown takes place at the p-n junction by providing an appropriate junction termination extension. As a result, the current can flow uniformly through the entire p-n junction, and the Zener diodes exhibit excellent electric characteristics.

The present invention is not limited to the above example, and various modifications or alternations may be made without departing from the spirit and scope of the invention.

The invention claimed is:

1. A silicon carbide Zener diode having a mesa structure and comprising a silicon carbide single crystal substrate of a first conductivity type, formed thereon, a silicon carbide conductive layer of a first conductivity type, and a silicon carbide conductive layer of a second conductivity type formed on the silicon carbide conductive layer of a first conductivity type, wherein
   a depletion layer that is formed under reverse bias at a junction between the silicon carbide conductive layer of a first conductivity type and the silicon carbide conductive layer of a second conductivity type does not reach a mesa corner formed in the silicon carbide conductive layer of a first conductivity type at the breakdown voltage.

2. The silicon carbide Zener diode according to claim 1, wherein in a mesa peripheral region around the mesa structure, a continuous junction termination extension is formed at least from a p-n junction to the mesa corner.

3. The silicon carbide Zener diode according to claim 2, wherein:
   the junction termination extension is of a first conductivity type;
   the junction termination extension has a thickness of 10 nm to 1 µm; and
   the doping density of the junction termination extension is not more than 50% of the doping density of the silicon carbide conductive layer of a first conductivity type.

4. The silicon carbide Zener diode according to claim 2, wherein:
   the junction termination extension is of a second conductivity type;
   the junction termination extension has a thickness of 10 nm to 1 µm; and
   the doping density of the junction termination extension is not more than 25% of the doping density of the silicon carbide conductive layer of a first conductivity type.

5. The silicon carbide Zener diode according to claim 2, wherein the junction termination extension is formed by ion implantation.

6. The silicon carbide Zener diode according to claim 5, wherein the junction termination extension is formed by ion implantation of aluminum, nitrogen or phosphorus.

7. The silicon carbide Zener diode according to claim 1, wherein the silicon carbide conductive layer of a first conductivity type is formed by epitaxial growth and has a thickness of not less than 2 µm.

8. The silicon carbide Zener diode according to claim 3, wherein the junction termination extension is formed by ion implantation.

9. The silicon carbide Zener diode according to claim 8, wherein the junction termination extension is formed by ion implantation of aluminum, nitrogen or phosphorus.

10. The silicon carbide Zener diode according to claim 4, wherein the junction termination extension is formed by ion implantation.

11. The silicon carbide Zener diode according to claim 10, wherein the junction termination extension is formed by ion implantation of aluminum, nitrogen or phosphorus.

12. The silicon carbide Zener diode according to claim 2, wherein the silicon carbide conductive layer of a first conductivity type is formed by epitaxial growth and has a thickness of not less than 2 µm.

13. The silicon carbide Zener diode according to claim 3, wherein the silicon carbide conductive layer of a first conductivity type is formed by epitaxial growth and has a thickness of not less than 2 µm.

14. The silicon carbide Zener diode according to claim 4, wherein the silicon carbide conductive layer of a first conductivity type is fowled by epitaxial growth and has a thickness of not less than 2 µm.

15. The silicon carbide Zener diode according to claim 5, wherein the silicon carbide conductive layer of a first conductivity type is formed by epitaxial growth and has a thickness of not less than 2 µm.

16. The silicon carbide Zener diode according to claim 6, wherein the silicon carbide conductive layer of a first conductivity type is formed by epitaxial growth and has a thickness of not less than 2 µm.

* * * * *

UNITED STATES PATENT AND TRADEMARK OFFICE
CERTIFICATE OF CORRECTION

PATENT NO. : 8,093,599 B2  Page 1 of 1
APPLICATION NO. : 12/597121
DATED : January 10, 2012
INVENTOR(S) : Ryosuke Ishii et al.

It is certified that error appears in the above-identified patent and that said Letters Patent is hereby corrected as shown below:

Column 12, Line 27, Claim 14, delete "fowled" and insert -- formed --

Signed and Sealed this
Twenty-seventh Day of March, 2012

David J. Kappos
*Director of the United States Patent and Trademark Office*